US012628340B2

(12) United States Patent
Wang

(10) Patent No.: US 12,628,340 B2
(45) Date of Patent: May 12, 2026

(54) PHOTOLITHOGRAPHIC EXPOSURE METHOD FOR MEMORY

(71) Applicant: Shanghai Huahong Grace Semiconductor Manufacturing Corporation, Shanghai (CN)

(72) Inventor: Lei Wang, Shanghai (CN)

(73) Assignee: Shanghai Huahong Grace Semiconductor Manufacturing Corporation, Shanghai (CN)

( * ) Notice: Subject to any disclaimer, the term of this patent is extended or adjusted under 35 U.S.C. 154(b) by 1004 days.

(21) Appl. No.: 17/835,055

(22) Filed: Jun. 8, 2022

(65) Prior Publication Data

US 2022/0399356 A1 Dec. 15, 2022

(30) Foreign Application Priority Data

Jun. 9, 2021 (CN) .......................... 202110641291.2

(51) Int. Cl.
*H10B 41/35* (2023.01)
*H10P 50/00* (2026.01)
*H10P 76/40* (2026.01)

(52) U.S. Cl.
CPC ............. *H10B 41/35* (2023.02); *H10P 50/71* (2026.01); *H10P 76/4085* (2026.01); *H10P 76/4088* (2026.01)

(58) Field of Classification Search
CPC ............... H10B 41/35; H01L 21/0337; H01L 21/0338; H01L 21/32139; H01L 21/0274;
(Continued)

(56) References Cited

U.S. PATENT DOCUMENTS 6,165,692 A * 12/2000 Kanai ........................ G03F 1/30
430/311
2005/0054210 A1* 3/2005 Lu ............................. G03F 1/00
430/494

FOREIGN PATENT DOCUMENTS

CN 1570769 A 1/2005
CN 1700102 A 11/2005
(Continued)

OTHER PUBLICATIONS

Search report issued in corresponding CN Application No. 2021106412912, dated Jun. 15, 2022 pp. 1-2.
(Continued)

*Primary Examiner* — Jonathan Johnson
*Assistant Examiner* — Alexander N. Lee
(74) *Attorney, Agent, or Firm* — Harris Beach Murtha Cullina PLLC

(57) ABSTRACT

A photolithographic exposure method for a memory. In a photolithographic process for making a memory, when exposure is performed by using a mask, regions with different exposure dimension requirements on the memory are divided into different exposure groups. Regions with the same exposure resolution requirement are divided into the same group. Different exposure modes of exposure that are capable of correspondingly satisfying resolution requirements of each group are performed to different groups during exposure. During exposure, different illumination modes are adopted to perform exposure. Firstly, a first exposure mode is adopted to perform exposure to a memory array cell exposure group, then a wafer is kept stationary on a supporting platform, and then a second exposure mode is adopted to perform exposure to the other structure exposure group; after the exposure of all groups is completed, one-step development is performed to complete pattern transfer.

10 Claims, 6 Drawing Sheets

(58) Field of Classification Search
CPC ............. G03F 7/70433; G03F 7/70466; G03F
7/70475; H10P 50/71; H10P 76/4085;
H10P 76/4088; H10P 76/2041
See application file for complete search history.

(56) References Cited

FOREIGN PATENT DOCUMENTS

| | | | |
|---|---|---|---|
| CN | 101661221 | A | 3/2010 |
| CN | 105137725 | A | 12/2015 |
| CN | 109696797 | A | 4/2019 |
| CN | 112596347 | A | 4/2021 |
| JP | 2003203850 | A | 7/2003 |
| TW | 200519530 | A | 9/1993 |

OTHER PUBLICATIONS

Search report issued in corresponding CN Application No.
2021106412912, dated Feb. 15, 2023 pp. 1-2.

* cited by examiner

PHOTOLITHOGRAPHIC EXPOSURE METHOD FOR MEMORY

CROSS-REFERENCE TO RELATED APPLICATIONS

This application claims priority to Chinese patent application No. CN 202110641291.2, filed at CNIPA on Jun. 9, 2021, and entitled "PHOTOLITHOGRAPHIC EXPOSURE METHOD FOR MEMORY", the disclosure of which is incorporated herein by reference in entirety.

TECHNICAL FIELD

The present invention relates to the field of processes for manufacturing semiconductor devices, in particular to a photolithographic exposure method for a memory.

BACKGROUND

In a process for manufacturing a memory, the dimension reduction of memory cells is mainly subject to the limit resolution of a photolithographic process. In order to achieve the limit resolution, a Resolution Enhancement Technique (RET) is usually used. RET is to determine the optimum illumination condition through simulation calculation according to the existing mask design pattern, so as to realize the largest common process window, and this part of the work is usually completed at the early stage of research and development of a new photolithographic process. Common RETs include Off-Axis Illumination (OAI), Optical Proximity Correction (OPC), Phase-Shifting Mask (PSM), Sub-Resolution Assistant Feature (SRAF), and so on. Most RETs involve changing the shape and phase of a mask to some extent, so as to improve the quality of pattern transfer.

RETs, such as polarized illumination and OAI, are optimized aiming at dense patterns and have a better resolution, but become poorer for patterns with other dimensions. Curves illustrated in FIG. 1 reflect DOF relationships between traditional illumination, polarized illumination and off-axis illumination, and device dimension. DOF represents depth of focus, or is called depth of field, which refers to a range of a segment of focal plane in which a lithography machine can image clearly after focusing. Since there are not only memory cells in a memory chip, but also many other types of devices, such as digital logic control, IO and decoding circuit, referring to FIG. 2, CD (feature dimension or critical dimension) requirements of different functional units and devices are completely inconsistent with patterns. A memory array in a memory belongs to dense pattern region, while a logic region and an IO region belong to relatively sparse pattern regions. These two regions have different requirements on exposure resolution in the photolithographic process.

At present, the existing photolithographic process cannot meet the device requirements of different functional units (or regions with different pattern densities) at the same time. In order to achieve the balance, a sacrifice is needed from respective parts, so the reduction of memory array cells is greatly affected by a peripheral circuit.

SUMMARY

A technical problem to be solved by the present invention is to provide a photolithographic exposure method for a memory, which can reduce the dimension of memory devices under the situation of limited photolithographic capability.

In order to solve the problem, the photolithographic exposure method for the memory provided by the present invention includes the following steps:

in a photolithographic process for making a memory, when exposure is performed by using a mask, regions with different exposure dimension requirements on the memory are divided into different exposure groups;

the division of the exposure groups is based on different exposure resolution requirements, regions with the same exposure resolution requirement are divided into the same group, and patterns on the mask are divided into a plurality of exposure groups according to different exposure illumination requirements;

during exposure, different exposure modes of exposure that are capable of correspondingly satisfying resolution requirements of each group and have the smallest influence on other exposure groups are respectively performed to the exposure groups with different exposure resolution requirements.

In an embodiment, the memory includes memory array cell regions and other structure regions, and the memory array cell regions and other structure parts are divided into different exposure regions to divide the mask into different exposure groups which include a memory array cell exposure group of the memory and other structure exposure group formed by patterns of structures except memory array cells on the memory; patterns of the memory array cell exposure group have the highest pattern density, and patterns of the other structure exposure group have a lower pattern density than the memory array cell exposure group.

In an embodiment, the other structure exposure group of the memory includes a logic device region and an IO region.

In an embodiment, different illumination modes are adopted to perform exposure: firstly, a first exposure mode is adopted to perform exposure to the memory array cell exposure group with the higher pattern density, then the wafer is kept stationary on a stage, and then a second exposure mode is adopted to perform exposure to the other structure exposure group with the lower pattern density; after the different sequential exposure respectively performed to the different exposure groups is fully completed, one-step development is performed to complete transfer of all patterns.

In an embodiment, the first exposure mode is an exposure mode with a higher resolution for dense patterns, and the second exposure mode has a better resolution for relatively sparse pattern regions.

In an embodiment, the first exposure mode includes polarized illumination and off-axis illumination.

In an embodiment, by performing the different exposure modes of exposure to the different groups, there is no overlapping region between the exposed patterns, and the different exposure operations are independent of each other without needing any additional correction.

In an embodiment, the illumination modes of two or more times of exposure are different, and a conflict between requirements of the patterns in different exposure regions on the photolithographic process does not need to be considered.

In an embodiment, during exposure, a sequence of different exposure for different exposure groups is capable of being adjusted freely, for example, the second exposure mode is capable of being adjusted prior to the first exposure mode; the groups are capable of being divided into more exposure groups according to spans of dimension ranges of devices on a chip or different gradients of density, and more exposure modes are selected correspondingly.

In an embodiment, the exposure method is applicable to all chips having regions with different densities and having different exposure resolution requirements. The photolithographic exposure method for the memory provided by the present invention respectively adopts different exposure modes (illumination modes) for sparse regions and dense regions according to different exposure requirements of dense pattern regions and relatively sparse pattern regions, pertinently selects a better exposure mode for each group, improves the quality of pattern transfer, and can realize the manufacturing of memories with smaller dimensions under the situation of limited photolithographic capability.

DETAILED DESCRIPTION

Figure 1:
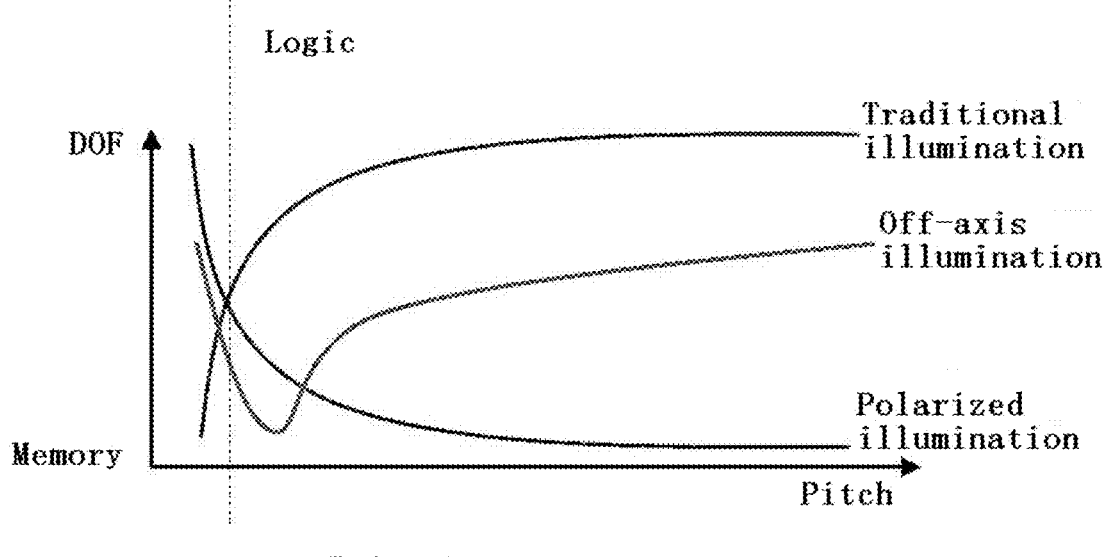
FIG. 1 illustrates DOF relationship curves between traditional illumination, polarized illumination and off-axis illumination, and device dimension of the prior art.
Figure 2:
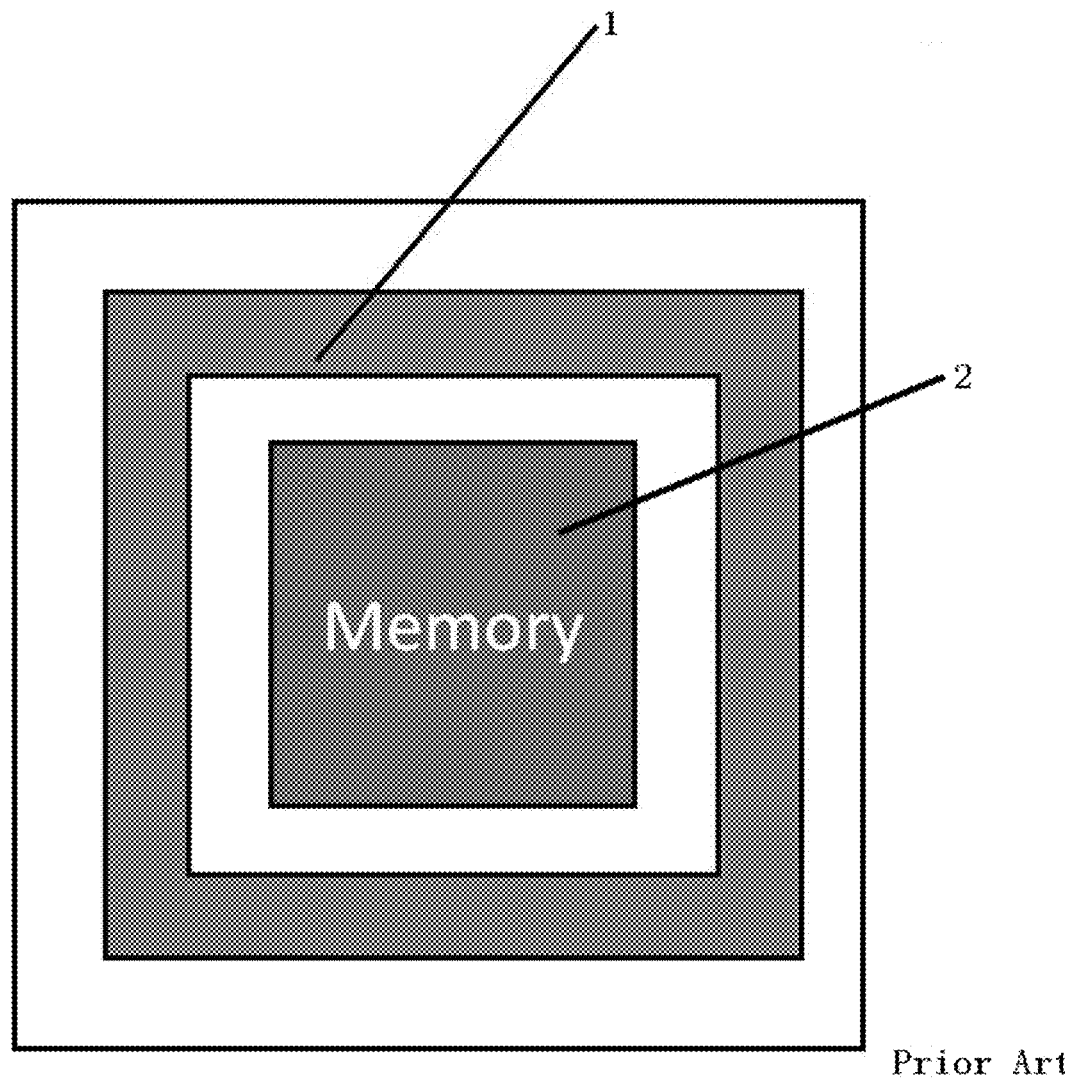
FIG. 2 illustrates a schematic diagram of brief structures in different regions of a memory of the prior art.

Specific embodiments of the present invention are provided below with reference to the drawings to clearly and completely describe the technical solution of the present invention, but the present invention is not limited to the following embodiments. Apparently, the described embodiments are part of the embodiments of the present invention, not all of them. According to the following description and claims, the advantages and features of the present invention will be clearer. It should be noted that the drawings are in a very simplified form and all use imprecise scales, which are only used for the purpose of conveniently and clearly describing the embodiments of the present invention. The present invention may be implemented in different modes and should not be interpreted as limited to the embodiments herein. On the contrary, providing these embodiments will make the disclosure thorough and complete, and completely convey the scope of the present invention to those skilled in the art. In the drawings, for the sake of clarity, the dimensions and relative dimensions of the layers and regions may be exaggerated, and the same reference signs throughout denote the same elements. It should be understood that when an element or layer is referred to as "on", "adjacent to", "connected to" or "coupled to" other elements or layers, it may be directly on, adjacent to, connected to, or coupled to other elements or layers, or there may be intermediate elements or layers. On the contrary, when elements are referred to as "directly on", "directly adjacent to", "directly connected to" or "directly coupled to" other elements or layers, there are no intermediate elements or layers. It should be understood that although the terms "first", "second", "third" and the like may be used to describe various elements, components, regions, layers and/or parts, these elements, components, regions, layers and/or parts should not be limited by these terms. These terms are only used to distinguish one element, component, region, layer or part from another. Therefore, without departing from the teaching of the present application, a first element, component, region, layer or part discussed below may be represented as a second element, component, region, layer or part.

The photolithographic exposure method for the memory provided by the present invention is mainly to solve the problem of inconsistent pattern exposure resolution requirements in the memory manufacturing process. Dense pattern regions need a high resolution, but a high-resolution exposure mode does not satisfy the exposure requirement of sparse pattern regions. For sparse pattern regions, the high-resolution exposure mode will reduce the pattern exposure effect. In other words, the high-resolution exposure mode is only suitable for dense pattern regions, but not for sparse pattern regions. In order to achieve a balance point, in the existing exposure process, a compromise exposure mode will be selected in the process for manufacturing memories, and the result is that neither of them can achieve an optimal effect, which has great limitations. Therefore, the present invention provides a solution, in which, in a photolithographic process for making a memory, when exposure is performed by using a mask, regions with different exposure dimension requirements on the memory are divided into different exposure groups, regions with the same exposure resolution requirement are divided into the same group, during exposure, different exposure modes of exposure that are capable of correspondingly satisfying resolution requirements of each group are respectively performed to the different exposure groups, and finally one-step development is performed only. Different exposure resolution requirements are divided according to the densities of different pattern regions on the chip. Regions with the similar density have the same exposure resolution requirement. The division of the exposure groups is performed accordingly.

Figure 3:
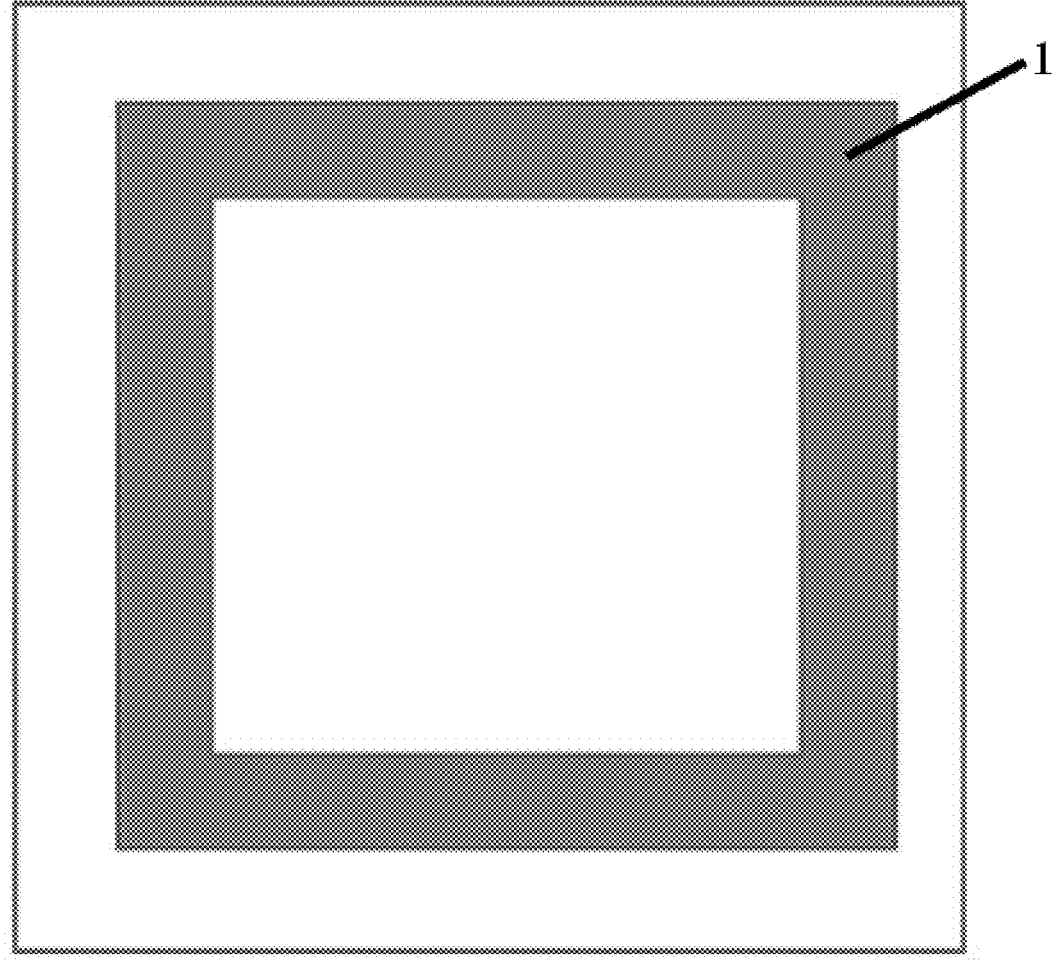
FIG. 3 illustrates a schematic diagram of corresponding exposure separately performed to relatively sparse pattern regions on a photolithographic mask as a group.
Figure 4:
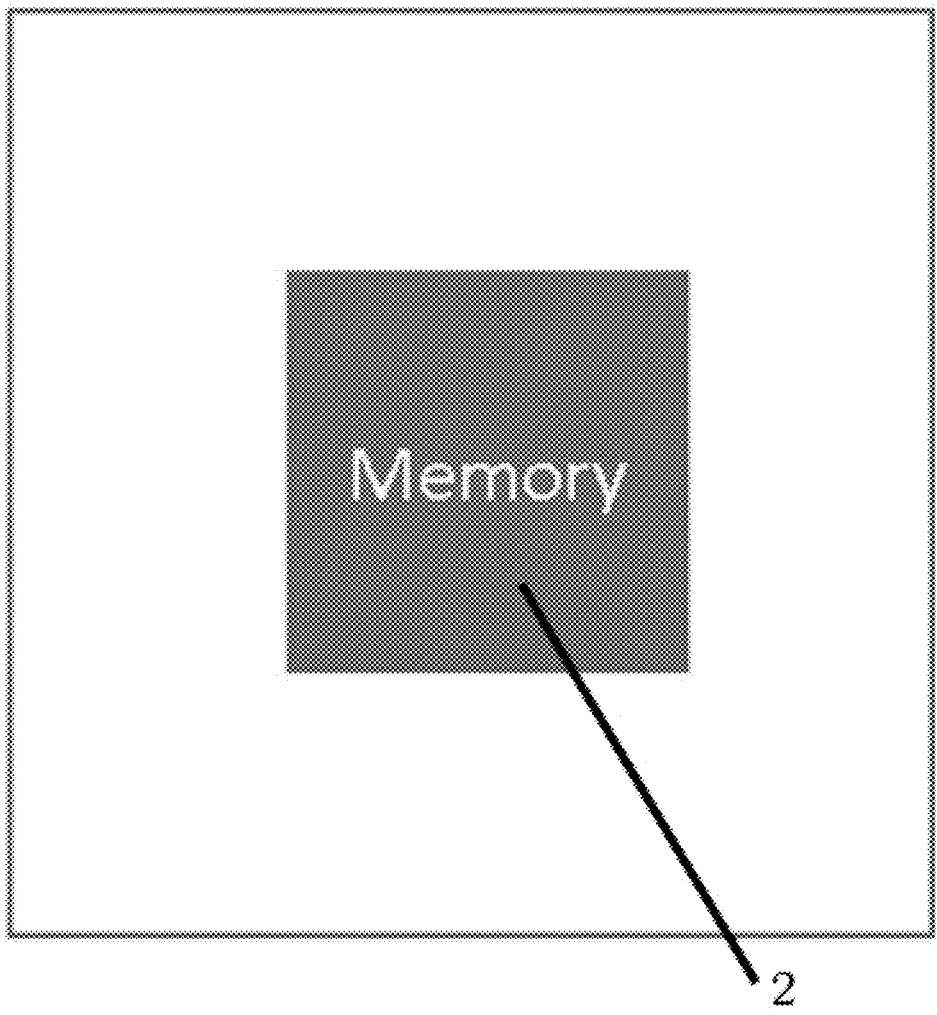
FIG. 4 illustrates a schematic diagram of corresponding exposure separately performed to relatively dense pattern regions, i.e., memory array regions, on a photolithographic mask as a group.

Taking the memory as an example, for the memory, the memory includes memory array cell regions and other structure regions, and the memory array cell regions and other structure parts are divided into different exposure regions to form different exposure groups. For the memory, generally, memory cell arrays belong to dense pattern regions, while other structure parts of the memory, generally including a logic device region and an IO region, belong to sparse regions with relatively low pattern intensity. Therefore, the exposure groups are divided into two groups. For other types of chips, more exposure groups can be divided. In fact, for the sparse regions with lower density in this embodiment, they can be subdivided into more exposure groups. Of course, this is related to the exposure capability range of different exposure modes. If it is not necessary, they may be directly divided into two exposure groups according to memory cell array regions 2 and other regions 1. Referring to FIG. 3 and FIG. 4, groups are divided according to a logic device region and an IO region 1 of the memory in FIG. 3, and groups are divided according to memory array cells 2 in FIG. 4 (what are illustrated in the drawings are just brief schematic diagrams of the method of the present invention, and the layout of the actual chip is very different from the legend shown in the present application). Therefore, different exposure groups may be formed on the mask, including a memory array cell exposure group of the memory and other structure exposure group formed by patterns of structures except memory array cells on the memory. These two exposure groups correspond to different exposure resolution requirements, which need to be treated differently in the subsequent exposure.

Figure 5:
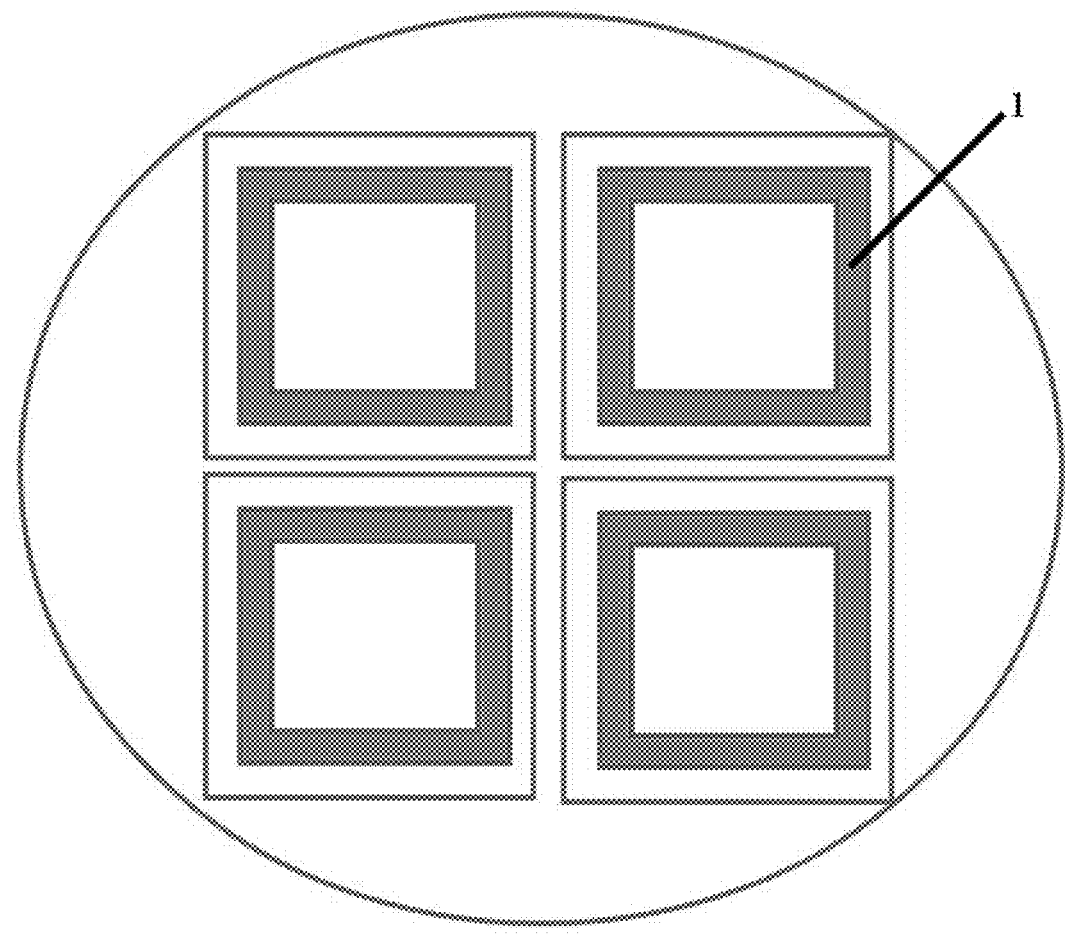
FIG. 5 illustrates a schematic diagram after exposure performed to relatively sparse regions on a memory on a wafer.
Figure 6:
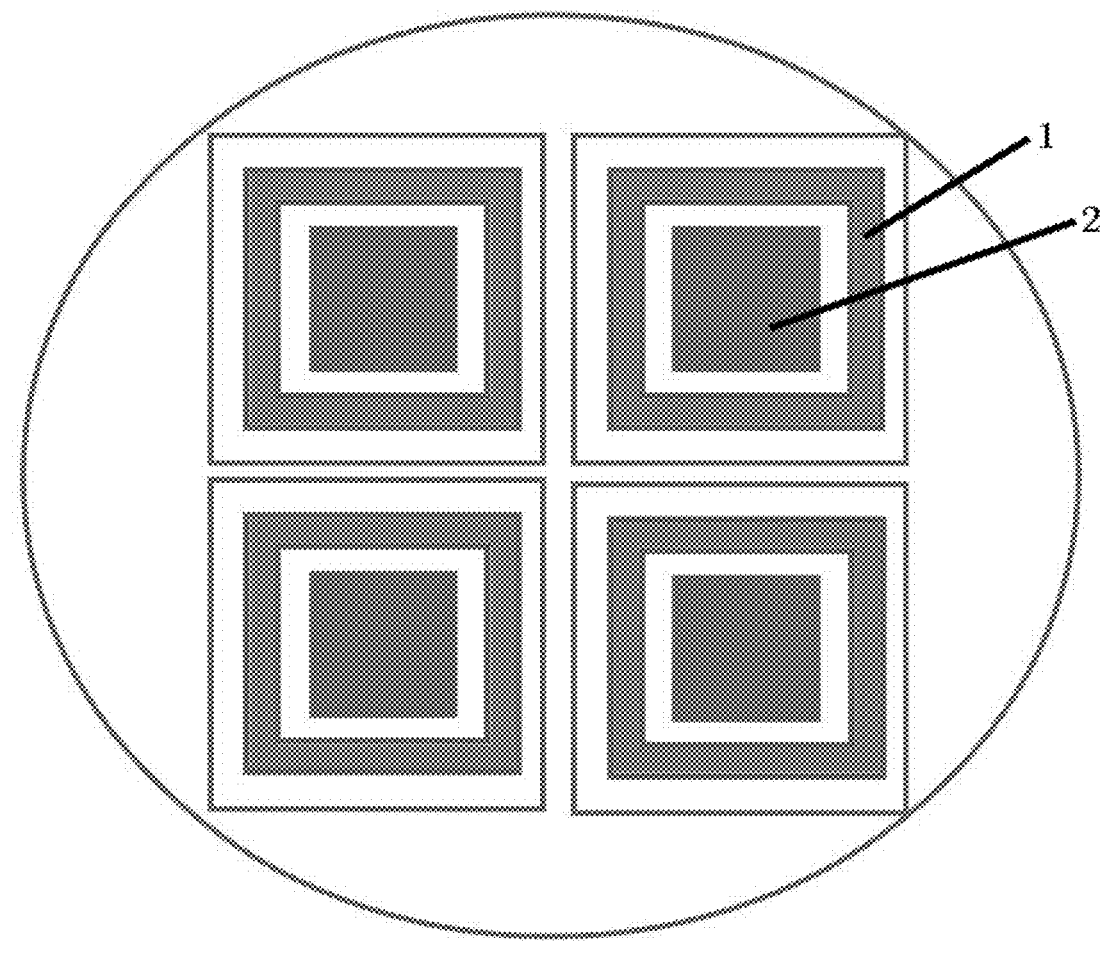
FIG. 6 illustrates a schematic diagram after exposure performed to relatively sparse regions on a memory on a wafer.

Different illumination modes are adopted to perform exposure: firstly, a first exposure mode is adopted to perform exposure to the memory array cell exposure group, which is an exposure mode with a higher pattern resolution for exposure of dense pattern regions, such as polarized illumination, off-axis illumination and other RET modes. After first exposure, a wafer is kept stationary on a supporting platform, and then a second exposure mode is adopted to perform exposure to the other structure exposure group. The second exposure mode has a better resolution for sparse pattern regions 1. Of course, a sequence of different exposure modes is not fixed. The exposure of sparse pattern regions 1 may be performed firstly, and then the exposure of dense pattern regions 2 is performed, referring to FIG. 5 and FIG. 6. The sequence of the exposure groups has no influence on the exposure effect. After all exposure operations are fully completed, one-step development is performed to complete pattern transfer.

Compared with the traditional exposure mode, the above method also has the advantage or difference that different exposure modes of exposure are performed to the different groups, there is no overlapping region between patterns at each time of exposure of different exposure groups or different exposure modes, so different exposure operations do not influence each other, and no additional correction is needed. In addition, the illumination modes for the two times of exposure are different, and a conflict between requirements of the patterns in different exposure regions on the photolithographic process does not need to be considered. It should be noted that this is completely different from the two times of exposure in the prior art. In the prior art, exposure of local dense patterns is performed in two times, the mutual influence needs to be contributed between the two times of exposure, and the exposed patterns need to be corrected.

The photolithographic exposure method for the memory provided by the present invention respectively adopts different exposure modes (illumination modes) for sparse regions and dense regions according to different exposure requirements of dense pattern regions and relatively sparse pattern regions, pertinently selects a better exposure mode for each group, improves the quality of pattern transfer, and can realize the manufacturing of memories with smaller dimensions under the situation of limited photolithographic capability.

It should be noted that the exposure method described in the present application is applicable not only to memory chips, but also to multiple exposure regions with different exposure resolution requirements on the same chip, which can pertinently divide the regions or structures with the similar exposure requirements into the same exposure group for exposure by adopting different exposure modes, so as to improve the pertinence and optimize the exposure effect.

What are described above are only exemplary embodiments of the present invention and are not used to limit the present invention. For those skilled in the art, the present invention may have various changes and variations. Any modification, equivalent replacement, improvement and the like made within the spirit and principle of the present invention shall be included in the scope of protection of the present application.

What is claimed is:

1. A photolithographic exposure method for a memory, wherein in a photolithographic process for making a memory, when exposure is performed by using a mask, regions with different exposure dimension requirements on the memory are divided into different exposure groups;

the division of the exposure groups is based on different exposure resolution requirements, regions with the same exposure resolution requirement are divided into the same group, and patterns on the mask are divided into a plurality of exposure groups according to different exposure illumination requirements; and during exposure, different exposure modes of exposure that are capable of correspondingly satisfying resolution requirements of each group are respectively performed to the exposure groups with different exposure resolution requirements.

2. The photolithographic exposure method for the memory according to claim 1, wherein the memory comprises memory array cell regions and other structure regions, and the memory array cell regions and other structure parts are divided into different exposure regions to divide the mask into different exposure groups which comprise a memory array cell exposure group of the memory and other structure exposure group formed by patterns of structures except memory array cells on the memory; patterns of the memory array cell exposure group have the highest pattern density, and patterns of the other structure exposure group have a lower pattern density than the memory array cell exposure group.

3. The photolithographic exposure method for the memory according to claim 2, wherein the other structure exposure group of the memory comprises a logic device region and an IO region.

4. The photolithographic exposure method for the memory according to claim 2, wherein different illumination modes are adopted to perform exposure: firstly, a first exposure mode is adopted to perform exposure to the memory array cell exposure group with the higher pattern density, then a wafer is kept stationary on a supporting platform, and then a second exposure mode is adopted to perform exposure to the other structure exposure group with the lower pattern density; after the different sequential exposure respectively performed to the different exposure groups is fully completed, one-step development is performed to complete transfer of all patterns.

5. The photolithographic exposure method for the memory according to claim 4, wherein the first exposure mode is an exposure mode with a higher resolution for dense patterns, and the second exposure mode has a better resolution for relatively sparse pattern regions.

6. The photolithographic exposure method for the memory according to claim 5, wherein the first exposure mode comprises polarized illumination and off-axis illumination.

7. The photolithographic exposure method for the memory according to claim 1, wherein by performing the different exposure modes of exposure to the different groups, there is no overlapping region between the exposed patterns, and the different exposure operations are independent of each other without needing any additional correction; each exposure using the same mask.

8. The photolithographic exposure method for the memory according to claim 4, wherein the illumination modes of two or more times of exposure are different, and a conflict between requirements of the patterns in different exposure regions on the photolithographic process does not need to be considered.

9. The photolithographic exposure method for the memory according to claim 4, wherein during exposure, a sequence of different exposure for different exposure groups is capable of being adjusted freely, and the second exposure mode is capable of being adjusted prior to the first exposure mode; the groups are capable of being divided into more exposure groups according to spans of dimension ranges of devices on a chip or different gradients of density, and more exposure modes are selected correspondingly.

10. The photolithographic exposure method for the memory according to claim 1, wherein the exposure method is applicable to all chips having regions with different densities and having different exposure resolution requirements.

* * * * *